United States Patent [19]

Wong et al.

[11] Patent Number: 4,554,640

[45] Date of Patent: Nov. 19, 1985

[54] PROGRAMMABLE ARRAY LOGIC CIRCUIT WITH SHARED PRODUCT TERMS

[75] Inventors: Sing Y. Wong; John M. Birkner, both of Sunnyvale, Calif.

[73] Assignee: Monolithic Memories, Inc., Santa Clara, Calif.

[21] Appl. No.: 575,845

[22] Filed: Jan. 30, 1984

[51] Int. Cl.[4] ............................................. H03K 19/20
[52] U.S. Cl. .................................... 364/716; 307/465; 340/825.83
[58] Field of Search ........................ 364/716; 307/465; 340/825.83, 825.84, 825.85, 825.86, 825.87

[56] References Cited

U.S. PATENT DOCUMENTS

| | | | |
|---|---|---|---|
| 3,987,286 | 10/1976 | Muehldorf | 364/716 |
| 4,032,894 | 6/1977 | Williams | 340/825.83 |
| 4,037,089 | 7/1977 | Horninger | 364/716 |
| 4,041,459 | 8/1977 | Horninger | 340/825.83 |
| 4,084,152 | 4/1978 | Long et al. | 340/825.87 |
| 4,123,669 | 10/1978 | Derine et al. | 364/716 |
| 4,124,899 | 11/1978 | Birkner et al. | 364/716 |
| 4,488,246 | 12/1984 | Brice | 364/716 |

Primary Examiner—David H. Malzahn
Attorney, Agent, or Firm—J. William Wigert, Jr.

[57] ABSTRACT

A programmable array logic circuit is provided having a programmable AND gate array and having means for connecting individual AND gate outputs to the input of one or the other of a pair of neighboring OR gates. This allows the product terms to be shared between two outputs.

4 Claims, 3 Drawing Figures

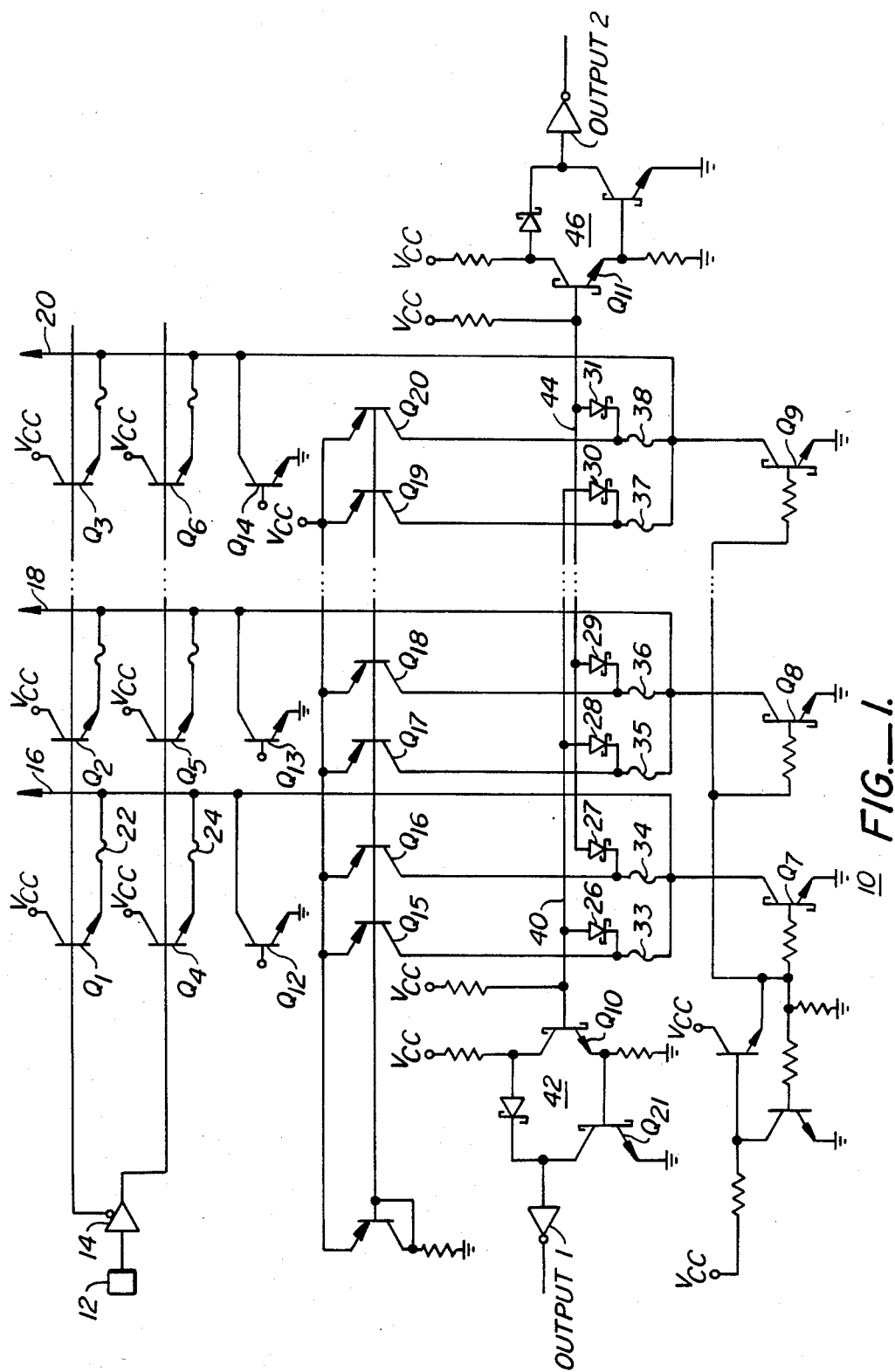
FIG._1.

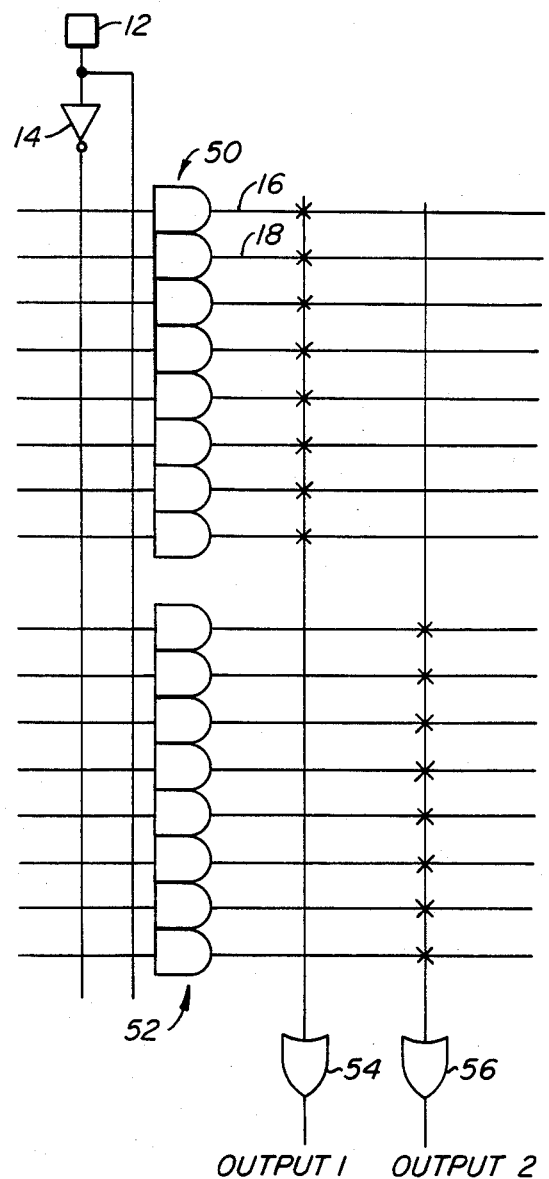
FIG._2.
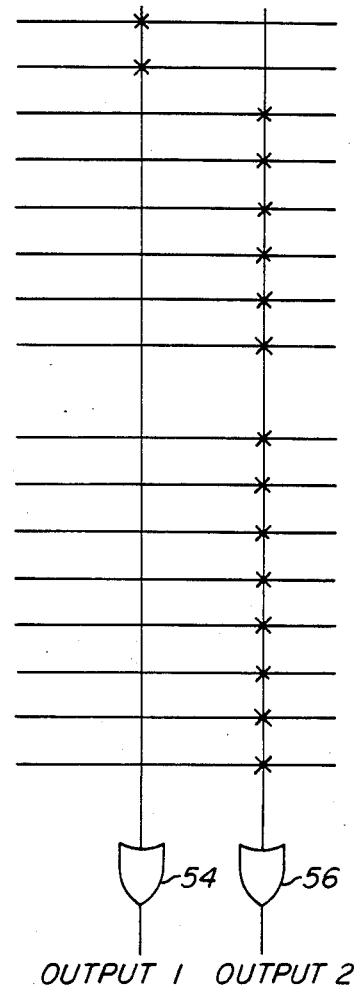
FIG._3.

PROGRAMMABLE ARRAY LOGIC CIRCUIT WITH SHARED PRODUCT TERMS

DESCRIPTION

1. Technical Field

This invention relates to field programmable logic arrays and in particular to field programmable array logic circuits with shared product terms.

2. Background Art

Fusable links used in biopolar PROMS (Programmable Read Only Memories) have given the digital systems designer the ability to "write on silicon." In little more than a few seconds, an algorithm, a process, or a boolean transfer function can be permanently provided in the regular structure of an integrated circuit (IC) read only memory (PROM).

PROMs are useful for many purposes including microprogram stores for high speed processors and controllers, non-volatile program stores for minicomputers and microprocessors, and high speed character generation and look up tables.

More recently, programmable integated circuits have been extended to logic circuit arrays. These are sometimes referred to as PLAs (Programmable Logic Arrays) and FPLAs (Field Programmable Logic Arrays). FPLAs, in contrast to earlier mask-programmable circuits, can be programmed away from the place they are manufactured. Any problems in a programmed design that are discovered can be corrected simply by programming a new FPLA and discarding the old one. If the particular application has high enough volumes to cost justify it, a mask can be designed subsequently so that mask-programmable arrays can be made.

PLAs are used in the implementation of random logic networks, data routing, code converters, instruction decoders, state sequences, and a variety of other functions. Typical FPLAs comprise an array of logical AND and OR gates which can be programmed for a specific function. Each output function is the sum (logical OR) of selected products (logical ANDs) where each product is the product of selected polarities of selected inputs.

FPLAs can be programmed so that (1) any input line can be connected to any AND gate input and (2) any of the products (ANDs) can be summed by any of the OR gates. This is accomplished by providing a programmable array or matrix (1) between the circuit inputs and the AND gate inputs and (2) between the output of the AND gates and the inputs of the OR gates, respectively. The FPLA is then programmed by blowing or not blowing the fusible links connecting the conductors of the two arrays much the same way as PROMs are programmed.

Existing FPLAs as described above, while useful in many applications, have certain disadvantages. First, the size of the IC chip is quite large, due to the use of two programmable arrays per FPLA. This means lower yields, greater costs, and larger IC packages.

Secondly, the flexibility of such FPLAs is limited. They are limited as to the number of inputs, speed, and perhaps most importantly, architecture. Existing FPLAs are very limited in terms of the logical and arithmetical operations they can perform.

A more recent innovation in the programmable array logic circuit which is described in U.S. Pat. No. 4,124,899 and assigned to the same assignee as the present invention. Such devices comprise a single programmable array or matrix of circuit inputs and the inputs to a plurality of AND gates (product terms). Outputs from subgroups of AND gates, in turn, are nonprogrammably connected as inputs to individual, specified OR gates (sum of the products).

By making the AND gate inputs programmable, i.e. selectable by the designer, while having the OR gate inputs nonprogrammable, some design flexibility is sacrificed. However, the reduction in IC chip size more than makes up for the slight reduction in flexibility. Smaller chip size means greater yields and hence lower costs. Smaller chip size also means that smaller, more convenient packaging can be used.

A typical programmable array logic circuit device has eight product terms. The number of AND gates, or product terms, can be increased, but with the penalty of larger die or chip size. This in turn lowers yields, and increases the cost to produce.

DISCLOSURE OF THE INVENTION

It is therefore an object of the invention to make an improved programmable logic array.

Another object of the invention is to provide an improved field programmable array logic circuit which provides the advantages of a field programmable logic array but with up to twice as many product terms and without significant increase in die size, without an increase in power consumption, and without degradation in performance.

In accordance with the present invention, an AND gate array is provided having means for selectively connecting individual AND gate outputs to the input of one or the other of a pair of neighboring OR gates. It is not necessary to connect the output of an AND gate to either one of the OR gates. However, no AND gate is connected to more than a single OR gate.

By this arrangement the product terms are shared between two outputs. While this increases flexibility tremendously, it does so without any substantial increase in die size. Nor is power consumption increased nor performance degraded, compared with a conventional programmable array logic device.

BRIEF DESCRIPTION OF THE DRAWINGS

FIG. 1 is a schematic circuit diagram of the improved programmable array logic circuit of the present invention.

FIG. 2 is a schematic logic diagram of the improved programmable array logic circuit of FIG. 1.

FIG. 3 is a partial schematic logic diagram of that of FIG. 2, showing another logic configuration.

BEST MODE OF CARRYING OUT THE INVENTION

FIG. 1 is a circuit schematic diagram of a programmable array logic 10, in accordance with the present invention. A single input 12 is shown, connected to input buffer 14, which in turn is connected to product term line 16 through NPN transistors Q1 and Q4. It is also connected to product term line 18 through transistors Q2 and Q5 and so on up to the nth product term line 20 through transistors Q3 and Q6. Typically a programmable array logic circuit has 16 such product term lines but it can have any number which is desired.

Referring to product term line 16 as an example, the emitters of transistors Q1 and Q4 are connected to product term line 16 through titanium-tungsten fuses 22 and 24 respectively. Of course it should be understood that additional inputs can, and normally are, connected to product term line 16, in the same manner as input 12. Such additional inputs are omitted for clarity.

In accordance with the invention each product term line is shared between one of two outputs, output 1 and output 2. Each product term line is provided with a pair of Schottky diodes and a pair of fuses. Thus, product term line 16 is connected through fuse 33 to the cathode of Schottky diode 26 and through fuse 34 to the cathode of diode 27. Product term line 18 is connected through fuse 35 to diode 28 and through fuse 36 to diode 29. Product term line 20 is connected through fuse 37 to diode 30 and through fuse 38 to diode 31.

Connected to fuses 33 and 34 is a current source transistor Q7. Similarly current source transistor Q8 is connected through fuses 35 and 36 to diodes 28 and 29 respectively and current source transistor Q9 is connected through fuses 37 and 38 to diodes 30 and 31 respectively.

The anodes of diodes 26, 28, and 30 are connected via line 40 to a sensing circuit 42 for output 1. The anodes of diodes 27, 29, and 31 are connected via line 44 to sensing circuit 46 for output 2. Sensing circuit 42 includes a sense amplifier transistor Q10 and sensing circuit 44 includes a sense amplifier transistor Q11.

Operation of circuit 10 is now explained. If product term line 16 is selected to be connected to output 1, fuse 34 is blown. This is accomplished by energizing programming transistor Q12. Typically, a current of 70 mA is used to blow each fuse. This compares with a current of about 0.4 MA for normal operation. This disconnects product term line 16 from output 2. By blowing the appropriate fuses output 1 can be connected with up to all of the product term lines.

After fuse 34 is blown, the cathode of Schottky diode 27 is pulled up to Vcc by current source transistor Q16. This provides a constant voltage at the cathode of Schottky diode 27 to reduce its capacitive effects. Diode 27 is thus reversed biased and does not present significant loading at the base of sense transistor Q11. This same reverse biased condition is applied to all of the diodes 26–31 which are disconnected by blowing their respective fuses 33–38, through pullup provided by the current source transistors Q15–Q20.

Product term line 16 can be connected with output 2 by blowing open fuse 33. Similarly product term line 18 is connected to either output 1 or output 2 by blowing fuse 36 or 35 respectively; and product term line 20 is connected to either output 1 or 2 by blowing fuse 38 or 37 respectively.

A single product term line is connected to either output 1 or output 2 but not both. Thus, for example, when product line 16 is connected to either output 1 or output 2, NPN current source transistor Q7 only has to sink the current from one diode 26 or 27, but not both. In this way the power consumption of the current source transistors Q7–Q9 is kept at a minimum. In the event that inadvertently both fuses 33 and 34 are left unblown, the output at output 1 and 2 will not respond to any signal change at the AND gate input terminals.

Since the disconnected Schottky diodes are reversed biased, the actual capacitive loading at the base of the sense amplifier transistors Q11 and Q10 is that of the Schottky diode capacitance of diodes 26, 28, 30 and 27, 29, 31, respectively, but not the cathode-to-substrate capacitance of the Schottky diodes. This insures the same performance as standard programmable array logic circuits.

FIG. 2 is a logic schematic of the electrical schematic of FIG. 1. This form of circuit representation is explained in U.S. Pat. No. 4,124,899 identified above. Here two groups 50 and 52 of AND gates are shown which can be sumed by either OR gate 54 or 56. In this case the appropriate fuses are blown such that all of the outputs of the 50 group of OR gates are connected to output 1 and all of the outputs of the 52 group of OR gates are connected to output 2. In FIG. 3, a different configuration is illustratively shown. Here the same AND gates are sumed by the same OR gates except that the first two AND gates are sumed by OR gate 54 and the remaining fourteen AND gates are sumed by OR gate 56.

We claim:

1. A programmable integrated logic circuit array comprising:
    (a) a plurality of groups of logical AND gates;
    (b) a plurality of logical OR gates;
    (c) a matrix of electrical conductor lines arranged in rows and columns comprising:
        (i) input lines, and
        (ii) AND gate input lines for each of the AND gates within said plurality of groups of logical AND gates;
    (d) connecting means for selectively connecting the outputs from individual ones of said AND gates to the inputs of one or the other, but not both, of a pair of logical OR gates from among said plurality of logical OR gates; and
    (e) means for selectively connecting input lines and AND gate input lines to program a desired logical output from said OR gates.

2. A programmable integrated logic circuit array as in claim 1 wherein said connecting means comprises fuseable links.

3. A programmable integrated logic circuit as in claim 1 wherein said OR gate pairs are adjacent to each other.

4. A programmable array of integrated logic circuitry comprising:
    (a) a plurality of AND gates, each AND gate having a plurality of inputs and an output;
    (b) a programmable matrix comprising a plurality of input lines and said inputs to said AND gates arranged in rows and columns;
    (c) a plurality of OR gates;
    (d) programmable electrical connections between the outputs of sub-pluralities of said AND gates and predetermined and select individual neighboring pairs of said OR gates; and
    (e) means for selectively connecting individual ones of said AND gate outputs to one, but not both, inputs of said OR gate pairs.

* * * * *